United States Patent
Yagami

(10) Patent No.: US 7,193,284 B2
(45) Date of Patent: Mar. 20, 2007

(54) MAGNETORESISTANCE EFFECT ELEMENT, METHOD OF MANUFACTURE THEREOF, MAGNETIC STORAGE AND METHOD OF MANUFACTURE THEREOF

(75) Inventor: Kojiro Yagami, Miyagi (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/933,418

(22) Filed: Sep. 3, 2004

(65) Prior Publication Data

US 2005/0057992 A1 Mar. 17, 2005

(30) Foreign Application Priority Data

Sep. 12, 2003 (JP) ............................ P2003-320923

(51) Int. Cl.
*H01L 29/82* (2006.01)
*H01L 43/00* (2006.01)

(52) U.S. Cl. ............... 257/421; 257/295; 257/E27.006; 365/158

(58) Field of Classification Search ................. 257/421
See application file for complete search history.

(56) References Cited

U.S. PATENT DOCUMENTS 5,343,422 A * 8/1994 Kung et al. ................. 365/173
5,876,807 A * 3/1999 Muto .......................... 427/548
6,063,512 A * 5/2000 Osaka et al. ................. 428/812
6,917,088 B2 * 7/2005 Takahashi et al. ........... 257/422
2004/0038082 A1 * 2/2004 Tsumori ................. 428/694 SG
2005/0047283 A1 * 3/2005 Ruigrok .................... 369/13.14

FOREIGN PATENT DOCUMENTS

JP 2002-246566 8/2002
JP 2003-048614 2/2003

* cited by examiner

*Primary Examiner*—Tu-Tu Ho
(74) *Attorney, Agent, or Firm*—Rader Fishman & Grauer PLLC; Ronald P. Kananen

(57) ABSTRACT

The present invention is aimed at enabling a spin-transfer magnetization switching in the random access magnetic memory by reducing a switching current density in the spin-transfer magnetization switching to an order smaller than 10 MA/cm$^2$ and without causing breakdowns neither in the memory element which uses a TMR film nor in the element selection FET. The memory layer in the magnetoresistance effect element comprises a magnetic film having a value of saturation magnetization in a range from 400 kA/m to 800 kA/m. The memory layer comprises a magnetic film which contains one or more magnetic elements selected from the group of, for example, cobalt, iron and nickel, and which further contains a non-magnetic element. The non-magnetic element is contained at a ratio of, for example, 5 at % or more and less than 50 at %. A memory layer 12 in the memory cell has a dimension less than 200 nm$\phi$.

10 Claims, 4 Drawing Sheets

MEMORY CELL AREA 6F$^2$

MAGNETORESISTANCE EFFECT ELEMENT, METHOD OF MANUFACTURE THEREOF, MAGNETIC STORAGE AND METHOD OF MANUFACTURE THEREOF

CROSS REFERENCE TO RELATED APPLICATION

This application claims priority from Japanese Priority Application No. 2003-320923, filed on Sep. 12, 2003 with the Japanese Patent Office, the entire content of which is hereby incorporated by reference.

BACKGROUND OF THE INVENTION

1. Field of the Invention

The present invention relates to a magnetoresistance effect element and a magnetic storage using same in which a switching current density in a spin-transfer magnetization switching can be reduced, and which enable the spin-transfer magnetization switching to be performed without causing breakdowns of a memory element which uses a tunnel magneto resistance (hereinafter referred to as a TMR, an abbreviation of Tunnel Magneto Resistance), and of a selection element (e.g. a field effect transistor (hereinafter referred to as a FET, an abbreviation of Field Effect Transistor)).

2. Description of Related Art

In a conventional magnetic storage, magnetization switching of a magnetoresistance effect element is operated by a current-induced magnetic field induced from a current line which is disposed electrically separated from the magnetoresistance effect element, and which is one of current lines which are intercrossing three-dimensionally (e.g. orthogonally intercrossing) with the magnetoresistance effect element being interposed therebetween (refer, for example, to patent document 1). However, there has been such a problem that if the size of a memory cell is reduced in order to increase its capacity, a switching magnetic field will increase abruptly, and in conjunction therewith, also, a required current will increase abruptly. Further, there is another problem that if the size of a memory cell is reduced smaller than 200 nm φ, which will be necessary in order to realize a super gigabit scale (G bit) capacity, a value of current required for writing will exceed an upper limit of allowable current density in wiring, thereby inhibiting any further writing.

In contrast, in a magnetic storage using the spin-transfer magnetization switching, there is such an advantage that the smaller the size of a memory cell becomes, a current required for magnetization switching becomes smaller, which is suitable for manufacture of an extra large capacity magnetic storage (refer to, for example, patent document 2).

[Patent Document 1] JP-Patent Application Publication No.2002-246566

[Patent Document 2] JP Patent Application Publication No.2003-48614

A problem to be solved by the present invention is that because a current density required for the spin-transfer magnetization switching is at present more than $1 \times 10$ $MA/cm^2$, there occur breakdowns of a switching element using a TMR film, and of an element selection FET or the like. Although it is reported to have decreased a switching current by reducing the size (area) of a memory cell, there still remains a problem that because of an increase in the resistance in the element due to a reduced area of the memory cell, a required voltage for switching which is a product of the current and the resistance cannot be reduced. It is also reported that because of the necessity of reducing the current density for switching, the cell size is fabricated in the order of several, m to provide multiple magnetic domains, and to actuate magnetization switching by use of a current-induced magnetic field produced by a current perpendicular to the plane of the film, thereby enabling the magnetization switching to be performed at a current density in the order of 1 $MA/cm^2$. However, because of its switching current being as large as several tens mA, and because of its cell size increasing substantially, there is a problem that the memory cannot yet have a very large capacity.

SUMMARY OF THE INVENTION

The present invention is aimed at enabling a spin-transfer magnetization switching in the random access magnetic memory by reducing a switching current density in the spin-transfer magnetization switching to an order smaller than 1 $MA/cm^2$ and without causing breakdowns neither in the memory element which uses a TMR film nor in the element selection FET was realized by arranging the memory layer in the magnetoresistance effect element to be comprised of a magnetic film having a value of saturation magnetization in a range from 400 kA/m to 800 kA/m.

A magnetoresistance effect element according to the present invention is characterized by comprising a memory layer which is essentially comprised of a magnetic film having a value of saturation magnetization from 400 kA/m to 800 kA/m.

A method of manufacturing a magnetoresistance effect element according to the present invention is characterized by forming a lamination structure of a magnetic layer which functions as a reference layer when storing information, a non-magnetic layer, and a magnetic layer which functions as a memory layer, wherein the aforementioned memory layer is characterized by comprising essentially a magnetic film having a value of saturation magnetization from 400 kA/m to 800 kA/m.

A magnetic storage according to the present invention is characterized by comprising: an electrode to be connected to a read out element for reading information stored in a magnetoresistance effect element; a bit line provided in the upper direction of the aforementioned electrode; and a magnetoresistance effect element for storing information by use of a spin-transfer magnetization switching (a magnetization switching caused by transferring a polarized spin current perpendicular to the plane of the memory film, which has a lamination structure of a magnetic layer functioning as a reference layer, a non-magnetic layer and a magnetic layer functioning as a memory layer, and which is connected to the aforementioned electrode and the aforementioned bit line, wherein the aforementioned memory layer is characterized by comprising essentially a magnetic film having a value of saturation magnetization from 400 kA/m to 800 kA/m.

A method of manufacturing a magnetic storage provided with: an electrode to be connected to a read-out element for reading information stored in a magnetoresistance effect element; a bit line provided in the upper direction of the aforementioned electrode; and a magnetoresistance effect element for storing information by use of a spin-transfer magnetization switching, which has a lamination structure of a magnetic layer functioning as a reference layer, a non-magnetic layer and a magnetic layer functioning as a memory layer, and which is connected to the aforementioned electrode and the aforementioned bit line, wherein the memory layer is characterized by comprising essentially a magnetic film having a value of saturation magnetization from 400 kA/m to 800 kA/m.

According to a magnetoresistance effect element, a method of manufacturing the same, a magnetic storage and a method of manufacturing the same according to the present invention, it becomes possible to decrease a switching current density in spin-transfer magnetization switching in the order below 1 MA/cm$^2$. Thereby, a spin-transfer magnetization switching in a random access magnetic memory is enabled without causing a breakdown of a memory element which uses a TMR film, as well as without causing a breakdown of an element selection FET. While a TMR film is likely to break down (exceeds an upper limit of breakdown voltage (approximately 2 V)) when subjected to a spin-transfer magnetization switching by use of a conventional technology, a memory cell of the magnetoresistance effect element according to the present invention enables a spin-transfer magnetization switching in a TMR film because of its switching current density being reduced in a range from 100 kA/cm$^2$ to 10 MA/cm$^2$. Thereby, there can be realized such advantages that: the spin-transfer magnetization switching becomes applicable to a magnetic storage (e.g. MRAM); a large capacity magnetic memory having a super gigabit scale becomes possible because of its element area being reducible to a theoretical design size (6 F$^2$: where F is a design rule); a very small power consumption (a writing current smaller than 100 µA, a read out current of approximately 10 µA); a simplified control circuit because of its magnetization switching being operable only by reversing the directions of a current; a simplified element structure because of elimination of a current line for producing a current-induced magnetic field, which is suitable for facilitating a mass production, and so on.

The present invention addresses the above-identified ,and other problems associated with conventional apparatuses and methods.

A magnetoresistance effect element, a method of manufacturing same, a magnetic storage and a method of manufacturing same are applicable to a non-volatile memory device which is indispensable in the age of the ubiquitous.

DESCRIPTION OF THE PREFERRED EMBODIMENTS

A magnetoresistance effect element according to a preferred embodiment of the present invention will be described by referring to FIG. 1, which indicates a schematic construction in cross-section thereof.

Preferred Embodiment: 1

Figure 1:
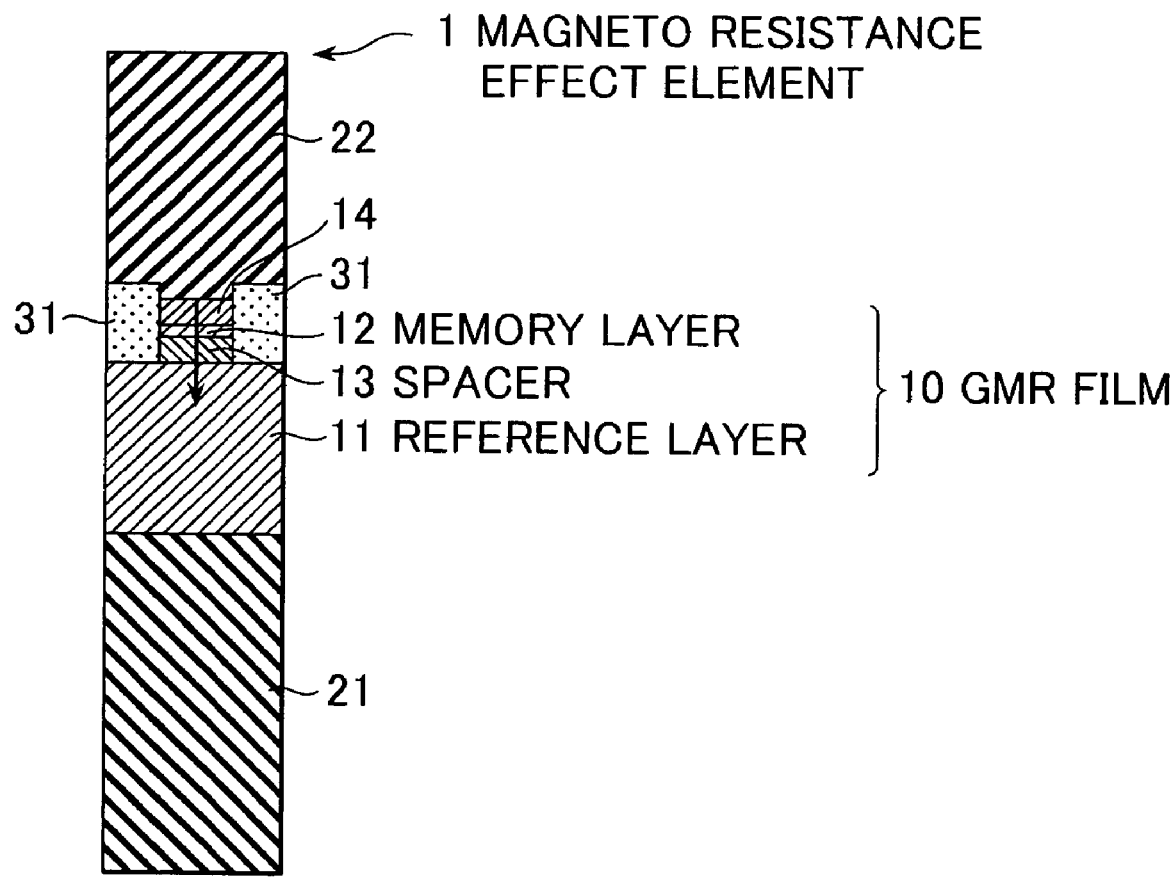
FIG. 1 is a schematic block diagram in cross-section of a magnetoresistance effect element according to a preferred embodiment of the present invention.

As shown in FIG. 1, a magnetoresistance effect element 1 is comprised of a CPP (Current Perpendicular to Plane)-GMR film having non-magnetic electrodes in the upper and the bottom directions. A GMR film 10 is comprised of a reference 100 inned magnetization) layer 11 made of a ferromagnetic film, a memory (magnetization switching) layer 12 made of a ferromagnetic film, and a spacer 13 made of a non-magnetic material which is interposed between the reference layer 11 and the memory layer 12. This spacer 13 is made of, for example, a copper (Cu) film. It is always necessary for the above-mentioned reference layer 11 to be thicker than the memory layer 12. A thickness of the memory layer 12, although it depends on a material thereof, is 1 nm to 10 nm, and more preferably 2 nm to 6 nm. A thickness of the reference layer 11, although it depends on its material, is necessary to be, for example, 4 nm or more and preferably less than 1 µm in consideration of ease of manufacture thereof although there is specified no upper limit. The spacer 13 described above should have a minimum required thickness capable of eliminating the influence of an interlayer magnetic coupling (Néel coupling and RKKY (Ruderman Kittel Kasuya Yoshida) interaction) between the reference layer 11 and the memory layer 12. For example, a thickness of 5 nm or more and less than 100 nm is preferable, and more preferably, 6 nm or more and less than 10 nm. Further, on the memory layer 12 there is formed a cap layer 14.

Usually, in fabrication of a magnetic film, ion milling is used. In order to prevent an interlayer static magnetic coupling (an antiferromagnetic coupling due to a leakage flux from a film edge portion) between the reference layer 11 and the memory layer 12, the ion milling is stopped above the plane of the reference layer 11 which is an underlayer magnetic film. In this structure, because that the memory layer 12 has a strong magnetic shape anisotropy, a coercive force (Hc) thereof is greater than that of the reference layer 11 the thickness of which is thicker. That is, with respect to an external magnetic field, the reference layer 11 is magnetically softer (magnetization switching easily takes place) than the memory layer 12. However, it should be noted that with respect to a current (CPP) transfer, the orientation of magnetization in the reference layer 11 which has a thicker film does not change, but it becomes a spin filter to produce a polarized spin current, and thus turning out to be a spin transfer source for the memory layer 12. In this meaning, the reference layer 11 is referred to as a pinned magnetization layer. An instance in which a current passes perpendicular to the plane of the GMR film 10, and electrons are flown from the memory layer 12 of thin magnetic film to the reference layer 11 of thick magnetic film (in the direction of an arrow) is defined as a positive direction of current.

Further, the GMR film 10 is formed on a bottom electrode 21 such that the reference layer 11 of the GMR film 10 is formed on the bottom electrode 21 in contact therewith. Furthermore, the spacer 13, the memory layer 12 and the cap layer 14 are embedded in an insulation layer 31 which is formed on the reference layer 11. In this insulation film 31, an opening 32 is formed such as to expose an upper surface of the cap layer 14. Then, an upper electrode 22 to be connected to the cap layer 14 of the GMR film 10 via the opening 32 is formed on the insulation film 31.

The memory layer 12 described above is made of a magnetic film having a saturation magnetization $M_s$ at 400 kA/m or more and less than 800 kA/m. As such a magnetic film, there is a magnetic film which contains one or more magnetic elements selected from the group of, for example, cobalt (Co), iron (Fe) and nickel (Ni), and which further contains, for example, a non-magnetic element. This non-magnetic element includes one or more elements selected from the group of tantalum (Ta), boron (B), chromium (Cr), platinum (Pt), silicon (Si), carbon (C) and nitrogen (N), and which are contained at a ratio of, for example, 5 at % or more and less than 50 at %. By way of example, a detailed description of an exemplary memory layer 12 (magnetic layer 120) will be set forth later.

A memory layer 12 in the memory cell described above has a length of 50 nm or more and less than 200 nm in the direction of the major axis thereof, and a length of 30 nm or more and less than 200 nm in the direction of the minor axis thereof, thereby the length in the direction of the major axis is longer than the length in the direction of the minor axis or equal thereto.

In the magnetoresistance effect element 1 described above, information recording to the memory layer 12 is carried out by a spin-transfer magnetization switching (Magnetization switching is effectuated by injecting a polarized spin current perpendicular to the plane of the film). A current density in this spin-transfer magnetization switching is set at 0.1 MA/cm$^2$ or more and less than 10 MA/cm$^2$.

The magnetoresistance effect element 1 described above has a memory cell of a super fine structure in the order of 100 nm$\phi$, whereby the advantages described above in the are realized. One of the main reasons of the super fine structure is to enhance the provision of a cell with a single magnetic domain. Thereby, a good spin-transfer magnetization switching characteristic can be obtained. Generally, the cell size is required to be reduced smaller than the width of a magnetic domain wall, for example, in the case of iron (Fe), the width of its magnetic domain wall is approximately 130 nm. According to a simulation by the Micro Magnetics, in the case of a rectangular cell having an aspect ratio (length/width)=1.5, and a film thickness=3 nm, almost a perfect single magnetic domain state is obtained if the length of its minor axis becomes smaller than 50 nm. In addition to the reason described above, there is another aim to suppress the influence of a magnetic field induced by a current perpendicular to the plane of the film. It has been reported that if the size of a magnetic film cell is in the order approximately of 100 nm$\phi$ or less, as to the torque acting on magnetic moments, a spin torque becomes more dominating than the magnetic field induced by a transfer current. In addition thereto, there is still another aim to equally distribute a transfer current and Joule heat within the cell plane. Still further, because a magnetization switching current becomes proportional to a volume of the magnetic film cell, the super fine configuration of the cell size results in a decrease in the switching current, thereby lowering a power consumption of the element, also suppressing the generation of a current-induced magnetic field and heat generation. By way of example, because of use of the magnetic film cell as a memory, the shape thereof is formed approximately into an elliptical shape thereby providing for a uniaxial anisotropy.

Preferred Embodiment: 2

In the next, a method of manufacturing a magnetoresistance effect element according to a preferred embodiment of the present invention will be described by referring to FIG. 2A through FIG. 2E. In FIG. 2A through FIG. 2E, as an example, a method of manufacturing a magnetoresistance effect element based on a milling process using a resist mask is shown.

Figure 2A:
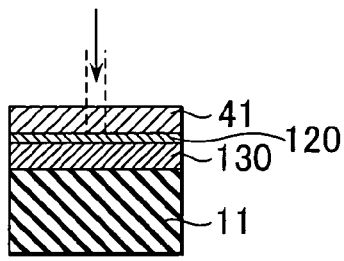
FIG. 2 consisting of FIG. 2A, FIG. 2B, FIG. 2C, FIG. 2D, and FIG. 2F, is a schematic block diagram in cross-section showing the steps of manufacturing the magnetoresistance effect element according to a preferred embodiment of the present invention.

Although not shown, a lower electrode is formed on a substrate, then as shown in FIG. 2A, a reference layer 11 is formed using a magnetic film on the lower electrode (not shown). Further, a copper (Cu) film 130 as a spacer, and a magnetic layer 120 as a memory layer are formed in lamination. This magnetic layer 120 is made of a magnetic film having a saturation magnetization $M_s$ of 400 kA/m or more and less than 800 kA/m. As this type of magnetic film, there are such ones which contain one or more magnetic elements selected from the group of, for example, cobalt (Co), iron (Fe) and nickel (Ni), and which further contain, for example, a non-magnetic element. This non-magnetic element comprises one or more elements selected from the group of tantalum (Ta), boron (B), chromium (Cr), platinum (Pt), silicon (Si), carbon (C) and nitrogen (N), and they are contained at a ratio of, for example, 5 at % or more and below 50 at %. By way of example, although not shown, a conducting film may be formed as a cap layer on the magnetic layer 120. An example of a memory layer 120 (magnetic layer 120) will be described in detail later.

After then, a resist film 41 is formed on the magnetic layer 120. As this resist film 41, for example, a negative type resist was used. Then, using a lithographic technology, the resist film 41 was patterned. Here, this patterning was carried out using electron beam lithography (such as an electron beam exposure, development and the like).

Figure 2B:
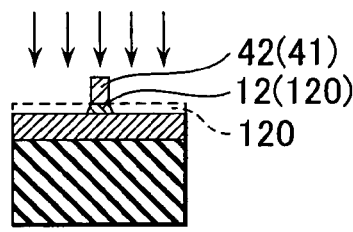

As a result, as shown in FIG. 2B, a very fine mask 42 (in the order of 100 nm$\phi$ diameter) is formed. In practice, the mask 42 is formed, for example, into an elliptical shape with a length of 95 nm and a breadth of 70 nm. Using this mask 42, a memory layer 12 is formed by processing the magnetic layer 120, for example, by ion milling. For this ion milling, for example, argon ions were used.

Figure 2C:
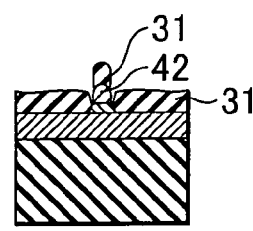

Then, as shown in FIG. 2C, an insulation film. 31 is formed to a height which is thinner than a total height of the memory layer 12 plus the mask 42. As this insulation film 31, for example, a silicon oxide was used. After then, the mask 42 was removed by lift-off, simultaneously removing the insulation film 31 on the mask 42.

Figure 2D:
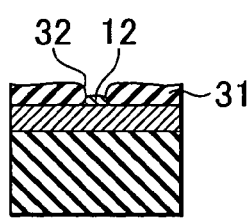

As a result, as shown in FIG. 2D, an opening 32 is formed in a portion of the insulation film 31 from which the mask 42 was removed (refer to FIG. 2C above). In this opening 32, there is exposed a surface of the memory layer 12, that is, a contact surface thereof to make contact with an upper electrode.

Figure 2E:
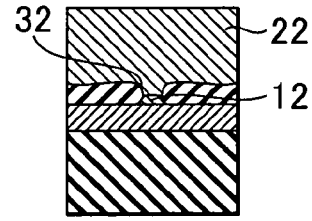

Subsequently, as shown in FIG. 2E, an upper electrode 22 which communicates with the memory layer 12 through the opening 32 is formed on the insulation film 31. It is one of advantages of this method of manufacture according to the present invention that the contacting between the upper electrode 22 and the memory layer 12 of the memory cell portion can be self aligned as described above.

In the next, characteristics of the magnetoresistance effect element 1 will be described. It should be noted hereinafter that dimensions of every cell are made in the order of 100 nm order, and every cell has approximately a single magnetic domain structure.

A plurality of magnetoresistance effect elements having various dimensions of approximately elliptical magnetic film cells are manufactured using a GMR film 10 comprising: a memory layer 12 which uses a Co—Fe—B alloy having a saturation magnetization of, for example, from 400 kA/m to 800 kA/m and a thickness of 2.5 nm; a reference layer 12 which uses a cobalt iron (Co—Fe10) alloy, for example, of 10 nm thick; and a spacer 13 which uses copper (Cu) of, for example, 6 nm thick.

In a magnetoresistance effect element with an elliptical cell having dimensions of 130×100 nm$^2$, a switching current was approximately 0.6 mA, and in a magnetoresistance effect element with an elliptical cell having dimensions of 150×100 nm$^2$, a switching current was approximately 0.8 mA. In both cases above, a current density was from 5 mA/cm$^2$ to 6 mA/cm$^2$. Both the switching current and the current density are confirmed to have decreased by one order less than the conventional cases. As an example of compositions of a Co—Fe—B alloy, it is preferable that Co is 5 at % or more and less than 50 at %; Fe is less than 30 at %; and B is 5 at % or more and less than 50 at %. By way of example, if the memory cell has approximately a single magnetic domain structure and thus is given with a uniaxial anisotropy, the memory cell may have any shape. It can be selected for its length approximately between 50 nm and 200 nm, and for its breadth approximately between 30 nm and 200 nm. However, in order to ensure a magnetic shape anisotropy, it is preferable that breadth≦length. If the size of the cell decreases, however, below a lower limit thereof, the function of the memory cannot be maintained due to the appearance of superparamagnetism. The lower limit of the cell size depends on respective magnetic materials.

In the exemplary example of the magnetoresistance effect element described above, although the Co—Fe—B alloy was used as a material for the magnetic film of the memory layer 12, however, it is not limited thereto, and any material may be used if it is a soft magnetic material having a saturation magnetization from 400 kA/m to 800 kA/m. As described hereinabove, as the compositions of the magnetic film for constituting the memory layer 12, there are contained one or more magnetic elements selected from the group consisting of cobalt (Co), iron (Fe) and nickel (Ni), and further contained one or more appropriate non-magnetic elements selected from the group consisting of tantalum (Ta), boron (B), chromium (Cr), platinum (Pt), silicon (Si), carbon (C) and nitrogen (N) at a ratio of 5 at % to 50 at %, in order to provide a preferable magnetic film having a saturation magnetization from 400 kA/m to 800 kA/m. For example, it may include a Ni—Fe—Ta alloy, Fe—Si alloy, Co—Cr alloy and the like. As to its film quality, it may be crystalline or amorphous. Otherwise, it may be a polycrystalline or a monocrystalline films.

With respect to a memory cell having a size less than 200 nmφ which is for use in a super Gbit scale magnetic storage, a magnetic film of the memory layer 12 based on the compositions described above having a saturation magnetization $M_s$<400 kA/m will have an insufficient thermal durability as its memory cell. Further, a magnetic film of the memory layer 12 having a saturation magnetization $M_s$>800 kA/m will require a current density for writing in the order in excess of 10 MA/cm$^2$, thereby inhibiting to reduce power consumption. By the way, the above-mentioned "thermal durability" refers to a phenomenon in which written information is lost while in storage due to the orientations of magnetization fluctuating at room temperature.

A decrease in the saturation magnetization $M_s$ results in a decrease in the thermal durability, however, if a value of saturation magnetization is within the range from 400 kA/m to 800 kA/m, a required thermal durability can be maintained by increasing the shape anisotropy of the memory cell or by increasing a magneto crystalline anisotropy of the magnetic film of the memory layer.

In the above description, it has been explained by way of example where a GMR film was used, however, it is not limited thereto, and a TMR film which has a larger quantity of change of magnetoresistance can be used as well. As an example of constructions of such a TMR film, there may be, for example, a lamination structure of: an underlayer/a magnetic film provided as a reference layer/an insulation barrier layer (e.g. an aluminum oxide ($Al_2O_3$) film of 1 nm or more and less than 2 nm thick)/a magnetic film provided as a memory layer (e.g. a Co—Fe—B alloy film of 2 nm or more and less than 5 nm thick)/a protection film.

Further, the GMR and the TMR films described above are of a coercive difference type, however, they may be of a spin valve type in which the direction of magnetization in a magnetic film provided as a reference layer is fixed (pinned) by provision of an appropriate antiferromagnetic film (for example, a platinum manganese (Pt—Mn) alloy, a manganese iridium (Mn—Ir) alloy or the like) under the magnetic film provided as the reference layer.

For the non-magnetic film 13 described above, in the case of a GMR film, generally copper (Cu) is used, however, other appropriate materials can be selected accordingly in combination with the magnetic material associated therewith. In the case of a TMR film, generally, aluminum oxide ($Al_2O_3$) is used, however, Al—N, Al—N—Zn or the like may be used as well in order to reduce electrical resistance.

As a magnetic film for use as the reference layer 11, a soft magnetic material generally available is used. As such a soft magnetic material, there are, for example, cobalt (Co), nickel iron (Ni—Fe), cobalt iron (Co—Fe), cobalt iron boron (Co—Fe—B) or the like. This magnetic film may be of a crystalline material or an amorphous material, and may be a polycrystalline or mono-crystalline films. Further, instead of the metal films described above, various magnetic semiconductors or half-metals may be used as well. The magnetic film provided as the reference layer may have a monolayer film structure or a synthetic ferrimagnet structure (two-layered magnetic film structure of a ferromagnetic film/a non-magnetic layer/a ferromagnetic layer in an antiferromagnetic coupling).

Figure 3A:
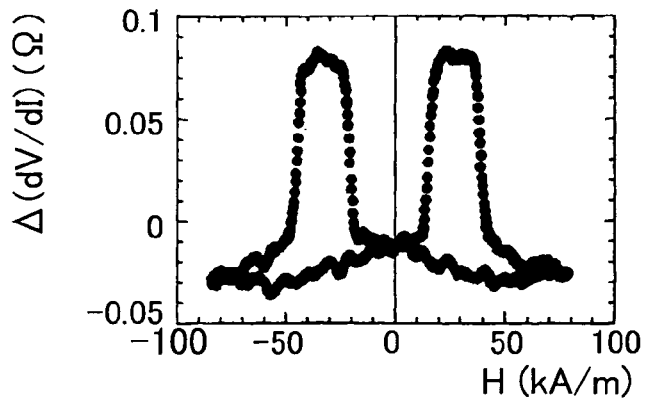
FIG. 3A and 3B are diagrams respectively showing an example of GMR curves and an example of R-I (resistance vs. current characteristics) obtained by measurements using a spin-transfer magnetization switching element having a conventional structure.
Figure 3B:
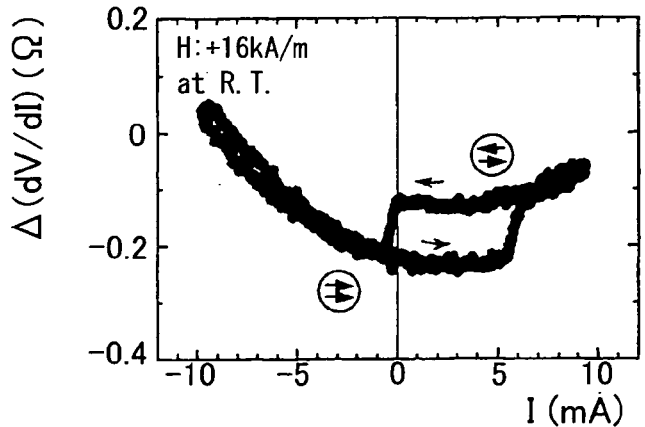

In the next, an example for use of comparison will be described. As a GMR film structure for comparison, there is fabricated a GMR film 10, comprising a reference layer made of a cobalt iron (Co—Fe$_{25}$) alloy, for example, of 40 nm thick; a memory layer made of a cobalt iron (Co—Fe$_{25}$) alloy, for example, of 2.5 nm thick; and a spacer made of copper (Cu), for example, of 6nm thick. Then, using this GMR film 10, a magnetoresistance effect element having approximately an elliptic shape of a magnetic film cell is manufactured. The dimensions of this elliptical cell are 150 nm in length and 85 nm in breadth. A saturation magnetization of the magnetic film of the memory layer is approximately 1700 kA/m. A GMR curve and a resistance vs. current (R—I) curve obtained by plotting results of measurements on a spin transfer magnetization switching element having the aforementioned structure are shown in FIG. 3A and 3B, respectively. The R—I curve shown here is an example obtained by measurements under a static magnetic field of +16 kA/m. A value on the ordinate axis depicts a variance of a differential resistance from a standard. An instance where a magnetic field is applied parallel to the magnetization in the reference layer is defined as a positive (+) magnetic field.

With reference to FIG. 3A, a typical coercivity difference type GMR curve is obtained, verifying that a good CPP-GMR element has been formed. A value of dc resistance of the element measured by a four-terminal method is approximately 5 Ω, a GMR ratio is 2% to 3%, and $H_c$ of the magnetic film cell is approximately 40 kA/m.

In an R—I curve shown in FIG. 3B, there clearly appears hysteresis due to the spin-transfer magnetization switching. The curve has approximately a concave shape, which is considered due to an increase in resistance due to a Joule heat. It is suggested from the figure that a magnetization array which is in a parallel state (P) at an initial stage (I=0 mA) changes abruptly into an anti-parallel state (AP) by a discontinuous increase in resistance when a current is increased in a positive direction in the vicinity of 5.5 mA to 6 mA ($I_c^{P \to AP}$), thereby switching from the parallel state (P) to the anti-parallel state (AP). After then, if the current is increased further, the array maintains the anti-parallel state (AP). If the current is decreased in a negative direction, a value of resistance abruptly decreases in the vicinity of −0.5 mA ($I_c^{AP \to P}$), thereby switching from the anti-parallel state (AP) to the parallel state (P). After then, in the region of the negative currents, the parallel state (P) thereof is maintained. A switching current under zero external magnetic field is 6 mA, and a current density ($|I_c^{P \to AP}|$/cell area) is approximately 60 MA/cm² (for a larger one of the two switching currents).

Preferred Embodiment: 3

A magnetic storage according to a preferred embodiment of the present invention will be described in the following.

Figure 4:
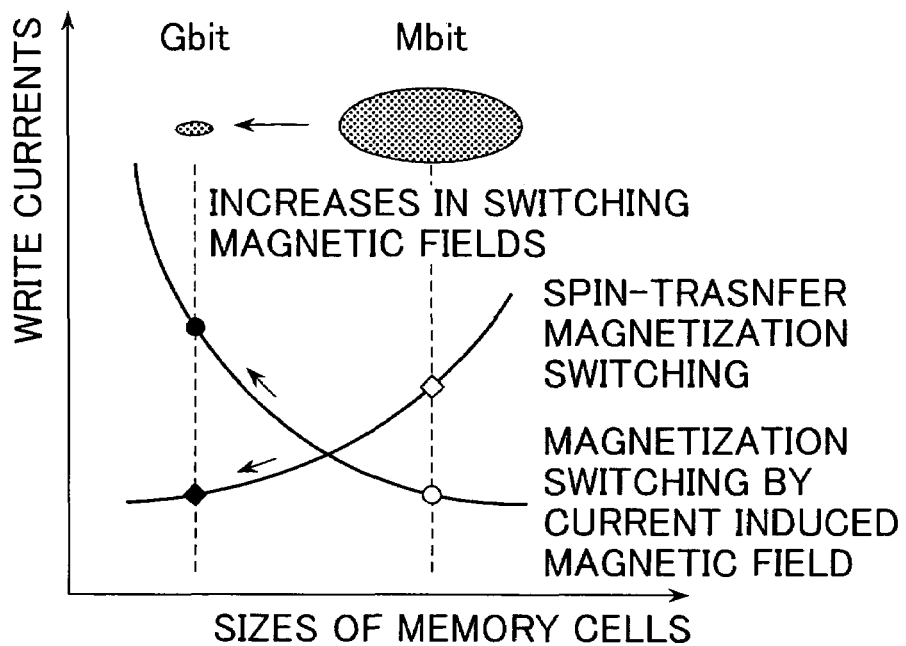
FIG. 4 is a diagram showing a relationship between write-currents versus sizes of a memory cell in a magnetic storage.

An MRAM is one of novel types of non-volatile solid state memories which utilize the magnetoresistance effect, and which has excellent potential capabilities such as a faster operation, a lower power consumption, a lower voltage drivability, a write-over frequency over $10^{15}$, a larger capacity available by finer patterning of a TMR element and an increased number of lamination and so on. In order to realize an MRAM on a Gbit scale, it is necessary to reduce the size of a memory cell in the order of 100 nm. However, as shown in FIG. 4, a magnetic field of magnetization switching in a memory cell which is made of a soft magnetic film increases in inverse proportion to a reduction in the size of the memory cell. Thereby, by a conventional writing method based on a current-induced magnetic field, its write current required increases remarkably, thereby inhibiting in practice to write. In contrast, according to the spin-transfer magnetization switching, a current required for switching decreases with a decrease in the cell size, thereby allowing simultaneous realization of an extra large capacity and a lower power consumption to be expected.

Figure 5A:
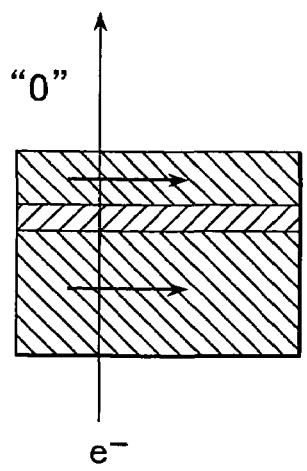
FIG. 5 consisting of FIG. 5A and FIG. 5B, is a schematic diagram showing a write operation based on the spin-transfer magnetization switching.
Figure 5B:
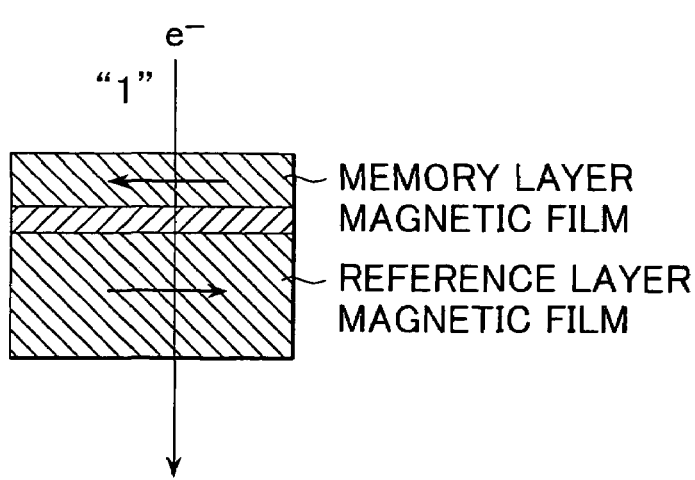

Further, with reference to FIGS. 5A and 5B, when writing on the basis of the spin-transfer magnetization switching, orientations of magnetization ("0" or "1" data) in the memory layer can be defined depending on the direction of a current. For example, as shown in FIG. 5A, if the orientation of magnetization in the magnetic film of reference layer and the orientation of magnetization in the magnetic film of memory layer are the same (as shown by arrows in the right directions), the data therein is defined to be "0". Then, as shown in FIG. 5B, if the orientation of magnetization (depicted by an arrow in the right direction) in the magnetic film of reference layer and the orientation of magnetization (depicted by an arrow in the left direction) in the magnetic film of memory layer are in opposite directions, the data therein is defined to be "1".

In the next, an exemplary structure of a magnetic storage based on a spin-transfer magnetization switching method which uses a magnetoresistance effect element according to the present invention will be described by referring to FIG. 6, in which a cross-sectional view of the schematic construction thereof is shown.

Figure 6:
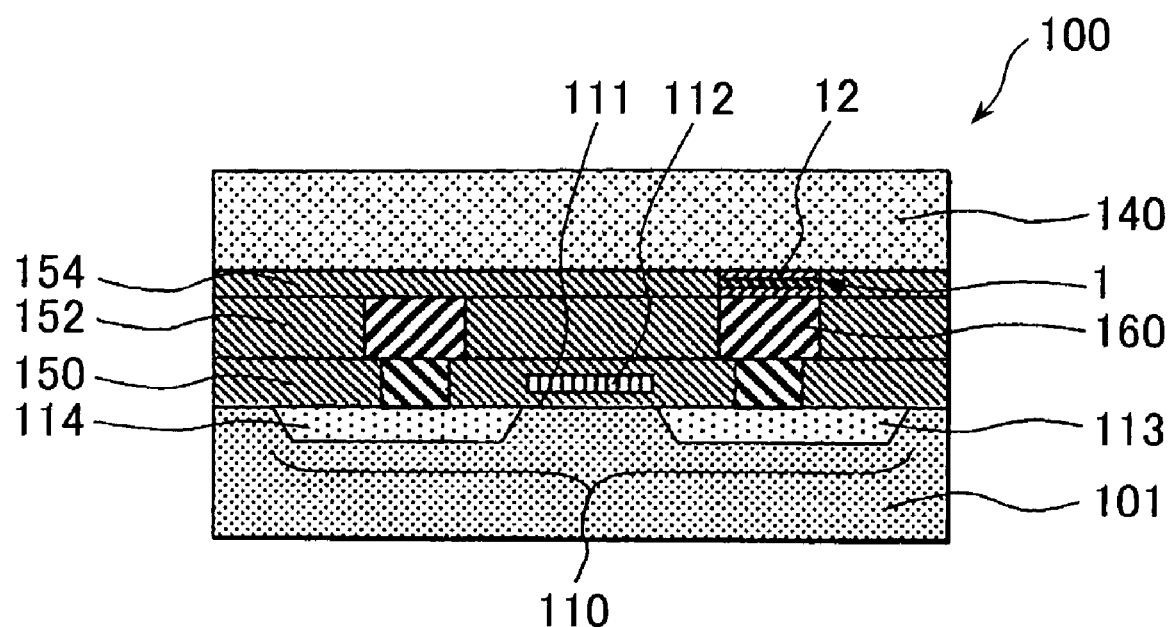
FIG. 6 is a schematic block diagram in cross-section of a magnetic memory device (MRAM) which uses the spin transfer magnetization switching and the magnetoresistance effect element of the present invention.

As shown in FIG. 6, the MRAM 100 described above is operable in a one-transistor one-junction (1T1J) mode in which a transistor 110 for element selection is disposed for each magnetoresistance effect element 1 constituting a memory cell. That is, the transistor 110 which is comprised of, for example, a field effect transistor is formed on a semiconductor substrate 101. An electrode 160 (which corresponds to the lower electrode 21 described with reference to FIG. 1) is connected to a drain region 113 of the transistor 110. Further, on the electrode 160 there is formed a magnetoresistance effect element 1 which is comprised of multiple films including a MTJ. On this magnetoresistance effect element 1 there is laid down a bit line 140 (which corresponds to the upper electrode 22 described above with reference to FI. 1) for writing. To this bit line 140 there are connected a plurality of magnetoresistance effect elements (not shown) provided as memory cells.

As described hereinabove, a memory layer 12 of the magnetoresistance effect element 1 is made of a magnetic film having a saturation magnetization $M_s$ larger than 400 kA/m and smaller than 800 kA/m. As such a magnetic film there are ones which contain one or more magnetic elements selected from the group of, for example, cobalt (Co), iron (Fe) and nickel (Ni), and which magnetic films further contain, for example, non-magnetic element. This non-magnetic element includes one or more species selected from the group consisting of tantalum (Ta), boron (B), chromium (Cr), platinum (Pt), silicon (Si), carbon (C) and nitrogen (N), and they are contained, for example, at a ratio more than 5 at % and less than 50 at %. Composition requirements for the magnetoresistance effect element 1 are similar to those already described above in detail with respect to the other preceding embodiments.

The magnetic storage 100 is enabled to read or write in accordance with a magnitude of a current passing through the magnetoresistance effect element 1 of the memory cell caused via the bit line 140. That is, writing is operable by passing a current in excess of a value of the magnetization switching current through the memory layer 12 of the magnetoresistance effect element 1, and reading is operable by passing a weak current that does not cause the magnetization switching. The whole current line required here is only the bit line 140, thereby simplifying the structure substantially.

In the magnetic storage 100 described above, a sppin transfer magnetization switching is possible in a TMR film, therefore, a magnetic switching of the memory layer with a MTJ (magnetic tunnel junction) is enabled only by a current transfer perpendicular to the plane of the layer, thereby enabling to control writing (at a large current, e.g. in the order of 100 μA) and reading (at a small current, e.g. in the order of 10 μA) by a quantity of currents. Therefore, the current line for generating magnetic fields for writing (a word line) is no more required, nor a bypass line is required, thereby enabling to simplify the construction of MRAM substantially and reducing the area of a memory cell to a theoretical minimal area of $6F^2$ (F: design rule) for a one-transistor plus one-TMR element construction. Thereby, the requirements for realizing a memory capacity of a G-bit scale can be satisfied. Further, because that the switching current will decrease with a reduction in the size of the magnetoresistance effect element 1, it becomes possible to read and write simply with a sense current. For example, a small current is used for reading, while a large current is used for writing. Further, because of the elimination of a half-selection state which exists when writing based on the current-induced magnetic field (a state in which a half of the switching magnetic field is applied in the direction of a difficult axis of magnetization in the memory cell), a thermal stability is ensured. In other words, the thermal durability is improved substantially. Further, as its element structure becomes very simple, the word line required for writing in the conventional MRAM becomes unnecessary nor the bypass line is required, and still further, because the magnetoresistance effect element 1 provided as the memory element can be disposed immediately above the transistor 110 provided as the selection element, it becomes more convenient to manufacture a very large scale integrated circuit.

Preferred Embodiment: 4

A method of manufacturing a magnetic storage according to a preferred embodiment of the present invention will be described in the following.

With reference to FIG. 6, the method of manufacturing the magnetic storage (e.g. MRAM) according to the preferred embodiment of the present invention is comprised of the steps of: forming a transistor 110 on a semiconductor substrate 101 by a method of forming a conventional field effect transistor, that is, after forming a gate insulation film 111 on the semiconductor substrate 101, a gate electrode 112 is formed thereon; forming a drain region 113 and a source region 114 on both sides of the gate electrode 112 in the semiconductor substrate 101; forming an insulation film 150 to cover the transistor 110; after forming a contact hole which reaches the drain region 113 of the transistor 110 through the insulation film 150, forming an electrode 160 which communicates with the drain region 113 through the contact hole; and forming an insulation film 152 to surround the electrode 160, then flattening the surface thereof to expose the surface of the electrode 160.

In the next step, by use of the method of manufacturing a magnetoresistance effect element 1 according to the preferred embodiment of the present invention, a magnetoresistance effect element 1 which is to be connected to the above-mentioned electrode 160 and which is to store information by use of the spin-transfer magnetization switching is formed thereon. Here, as described above, a memory layer 12 in the magnetoresistance effect element 1 is made of a magnetic film having a saturation magnetization $M_s$ larger than 400 kA/m and less than 800 kA/m. Such a magnetic film includes those that contain one or more species of magnetic elements selected from the group of, for example, cobalt (Co), iron (Fe) and nickel (Ni), and that further contain, for example, a non-magnetic element. This non-magnetic element includes one or more species selected from the group of tantalum (Ta), boron (B), chromium (Cr), platinum (Pt), silicon (Si), carbon (C) and nitrogen (N), and preferably they are contained at a ratio of, for example, 5 at % or more and less than 50 at %. These and other compositional requirements of the magnetoresistance effect element 1 are similar to those already described in detail with respect to the foregoing magnetoresistance effect elements of the present invention.

Subsequently, a bit line 140 which contacts with the upper surface of the magnetoresistance effect element 1 is formed on the insulation film 154. Then, an insulation film (not shown) to cover the bit line 140 is formed. By way of example, the bit line 140 may be formed by a trench wiring technology as well.

According to the method of the manufacture described above, because it is possible to manufacture a magnetic storage so as to be able to make the best use of the aforementioned features and characteristics thereof, it is enabled to manufacture the magnetic storage which features an excellent thermal durability, a simplified structure and suitability for constructing a very large scale integrated circuit.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetoresistance effect element having a memory layer, said memory layer comprising a magnetic film having a value of saturation magnetization from 400 kA/m to 800 kA/m, wherein said memory layer contains a non-magnetic element at a ratio of 5 at % or more and less than 50 at %, has a length of 50 nm or more and less than 200 nm in the direction of the major axis thereof, and has a length of 30 nm or more and less than or equal to 100 nm in the direction of the minor axis thereof, and wherein the length in the direction of the major axis is longer than the length in the direction of the minor axis.

2. A magnetoresistance effect element according to claim 1, wherein said magnetic film contains one or more magnetic elements selected from the group of cobalt (Co), iron (Fe) and nickel (Ni).

3. A magnetoresistance effect element according to claim 2, wherein said magnetic film further has a length of 50 nm or more and less than 200 nm in the direction of a major axis thereof, and a length of 30 nm or more and less than 200 nm in the direction of the minor axis thereof.

4. A magnetoresistance effect element according to claim 1, wherein a cell size of a memory cell of said magnetoresistance effect element is smaller than the width of a magnetic domain wall.

5. A magnetoresistance effect element according to claim 1, wherein said non-magnetic element includes one or more elements selected from the group of tantalum (Ta), boron (B), chromium (Cr), platinum (Pt), silicon (Si), carbon (C) and nitrogen (N).

6. A magnetoresistance effect element according to claim 1, wherein said memory layer has;
 a length of 50 nm or more and less than 200 nm in the direction of the major axis thereof, and
 a length of 30 nm or more and less than 200 nm in the direction of the minor axis thereof,
 wherein the length in the direction of the major axis is longer than the length in the direction of the minor axis or equal thereto.

7. A magnetoresistance effect element according to claim 1, wherein information recording to said memory layer is carried out by a spin-transfer magnetization switching, wherein a current density in said spin-transfer magnetization switching is set at 0.1 $MA/cm_2$ or more and less than 10 $MA/cm_2$.

8. A method of manufacturing a magnetoresistance effect element, characterized by forming a lamination structure of a magnetic layer which functions as a reference layer when storing information, a non-magnetic layer, and a magnetic layer which functions as a memory layer, wherein said memory layer comprises a magnetic film having a value of saturation magnetization from 400 kA/m to 800 kA/m, and wherein said memory layer contains a non-magnetic element at a ratio of 5 at % or more and less than 50 at %, has a length of 50 nm or more and less than 200 nm in the direction of the major axis thereof, and has a length of 30 nm or more and less than or equal to 100 nm in the direction of the minor axis thereof, wherein the length in the direction of the major axis is longer than the length in the direction of the minor axis.

9. A magnetic storage comprising:
   an electrode to be connected to a read out element for reading information stored in a magnetoresistance effect element;
   a bit line provided in the upper direction of said electrode; and
   a magnetoresistance effect element for storing information by use of a spin-transfer magnetization switching at a current density set at 0.1 MA/cm$_2$ or more and less than 10 MA/cm$_2$, which has a lamination structure of a magnetic layer functioning as a reference layer, a non-magnetic layer, and a magnetic layer functioning as a memory layer, and which is connected to said electrode and said bit line;
   wherein said memory layer comprises a magnetic film having a value of saturation magnetization from 400 kA/m to 800 kA/m, and wherein said memory layer contains a non-metallic element at a ratio of 5 at % or more and less than 50 at %, has a length of 50 nm or more and less than 200 nm in the direction of the major axis thereof, and has a length of 30 nm or more and less than or equal to 100 nm in the direction of the minor axis thereof, wherein the length in the direction of the major axis is longer than the length in the direction of the minor axis.

10. A method of manufacturing a magnetic storage as set forth in claim 9.

* * * * *